United States Patent
Iwasaki

(10) Patent No.: US 8,713,410 B2
(45) Date of Patent: Apr. 29, 2014

(54) DATA STORAGE APPARATUS, MEMORY CONTROL APPARATUS AND METHOD FOR CONTROLLING FLASH MEMORIES

(75) Inventor: Kiyotaka Iwasaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 123 days.

(21) Appl. No.: 13/301,335

(22) Filed: Nov. 21, 2011

(65) Prior Publication Data

US 2012/0192032 A1 Jul. 26, 2012

(30) Foreign Application Priority Data

Jan. 26, 2011 (JP) ................. 2011-014178

(51) Int. Cl.
*G11C 29/00* (2006.01)

(52) U.S. Cl.
USPC .......................................................... 714/773

(58) Field of Classification Search
USPC ............................ 714/773, 746, 75, 763–764
See application file for complete search history.

(56) References Cited

U.S. PATENT DOCUMENTS

| | | | |
|---|---|---|---|
| 6,421,274 B1 | 7/2002 | Yoshimura | |
| 7,372,744 B2 | 5/2008 | Shiga et al. | |
| 2006/0050314 A1 | 3/2006 | Shiga et al. | |
| 2006/0143553 A1 | 6/2006 | Takahashi et al. | |
| 2009/0024902 A1 * | 1/2009 | Jo et al. | 714/763 |
| 2009/0063934 A1 | 3/2009 | Jo | |
| 2011/0041039 A1 * | 2/2011 | Harari et al. | 714/773 |
| 2011/0126079 A1 * | 5/2011 | Wu et al. | 714/763 |
| 2011/0202812 A1 | 8/2011 | Asano et al. | |
| 2011/0214033 A1 | 9/2011 | Yoshii et al. | |

FOREIGN PATENT DOCUMENTS

| | | |
|---|---|---|
| JP | H09-218754 | 8/1997 |
| JP | 2002-288034 | 10/2002 |
| JP | 2002-544622 | 12/2002 |
| JP | 2006-073141 | 3/2006 |
| JP | 2006-190346 | 7/2006 |
| JP | 2008-299855 | 12/2008 |
| JP | 2009-501380 | 1/2009 |
| JP | 2009-054159 | 3/2009 |
| JP | 2011-165063 | 8/2011 |
| JP | 2011-180831 | 9/2011 |
| WO | WO 00/70459 | 11/2000 |
| WO | WO 2007/010189 A2 | 1/2007 |

OTHER PUBLICATIONS

Office Action dated May 14, 2013 for Japanese Application No. 2011-014178.

* cited by examiner

*Primary Examiner* — Shelly A Chase
(74) *Attorney, Agent, or Firm* — Knobbe Martens Olson & Bear LLP

(57) ABSTRACT

According to one embodiment, a data storage apparatus includes a channel controller, an error correction controller, and an additional correction module. The channel controller is configured to control writing to and reading from the non-volatile memories of respective channels. The error correction controller is configured to use inter-channel error correction codes during any read process, performing inter-channel correction process on those of the data items read under the control of the channel controller, which have been designated. The additional correction module is configured to designate, in accordance with errors detected by the channel controller, data items to additionally correct, and to notify the data items so designated to the error correction controller while the channel controller is reading the data necessary in the inter-channel correction process.

11 Claims, 8 Drawing Sheets

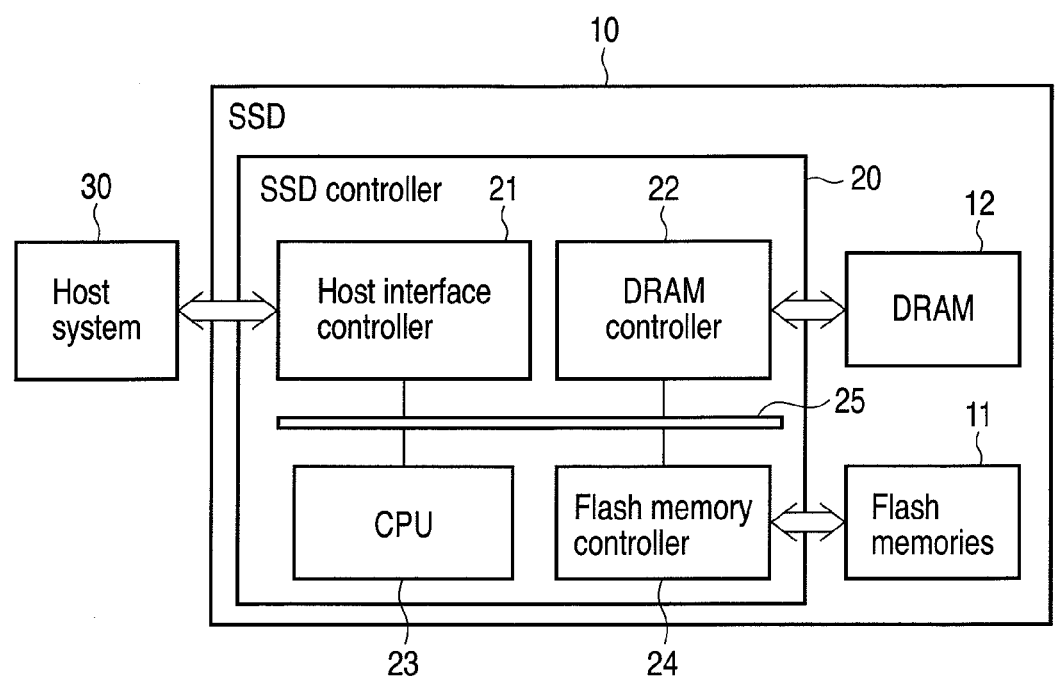
F I G. 1

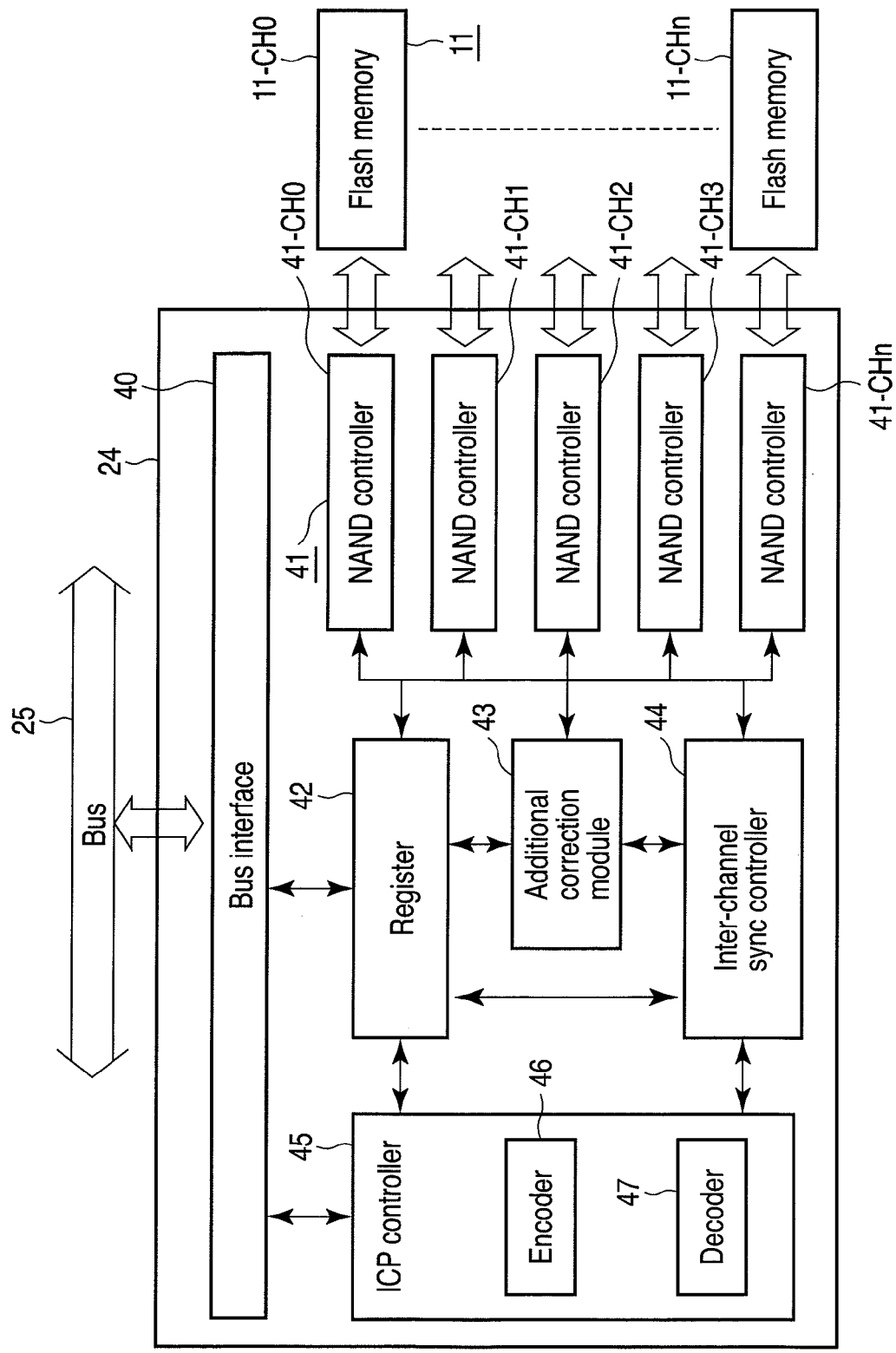
F I G. 2

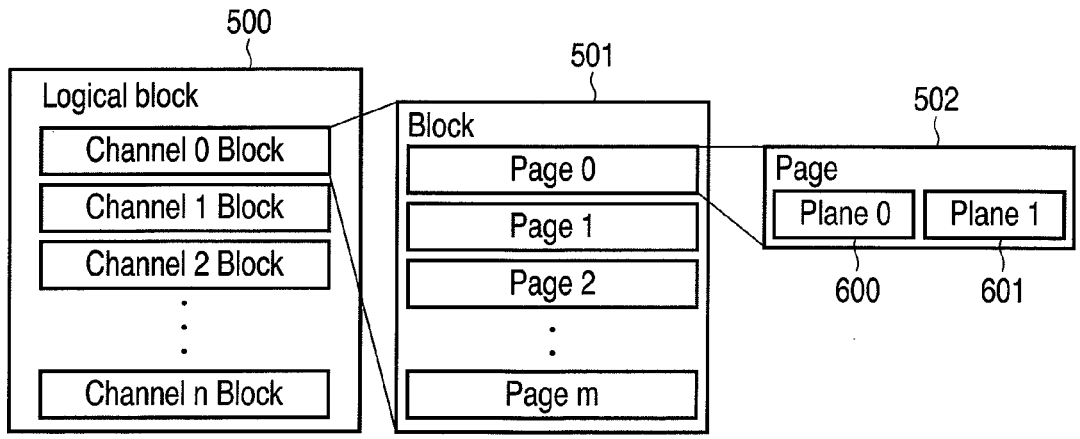
F I G. 5
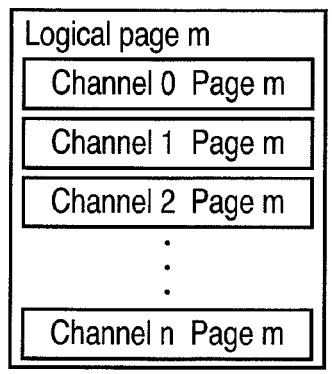
F I G. 6
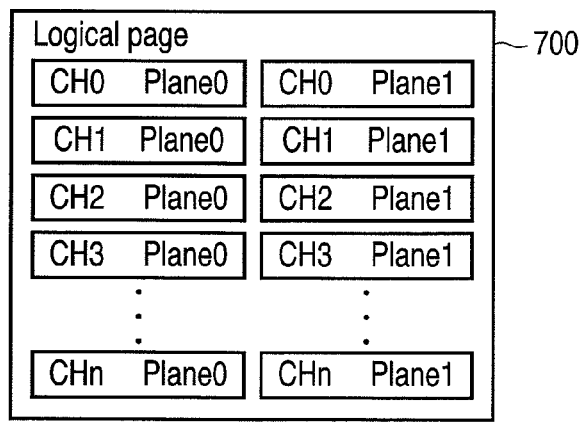
F I G. 7

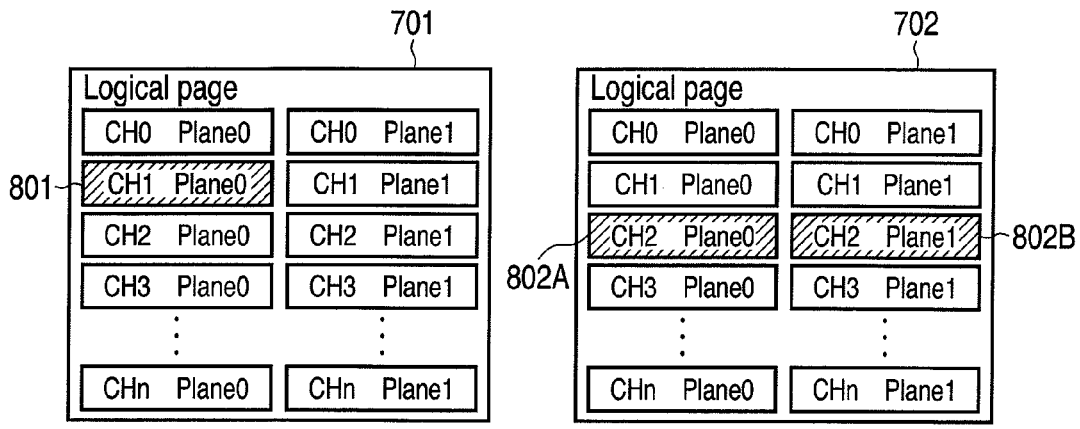
F I G. 8A  F I G. 8B
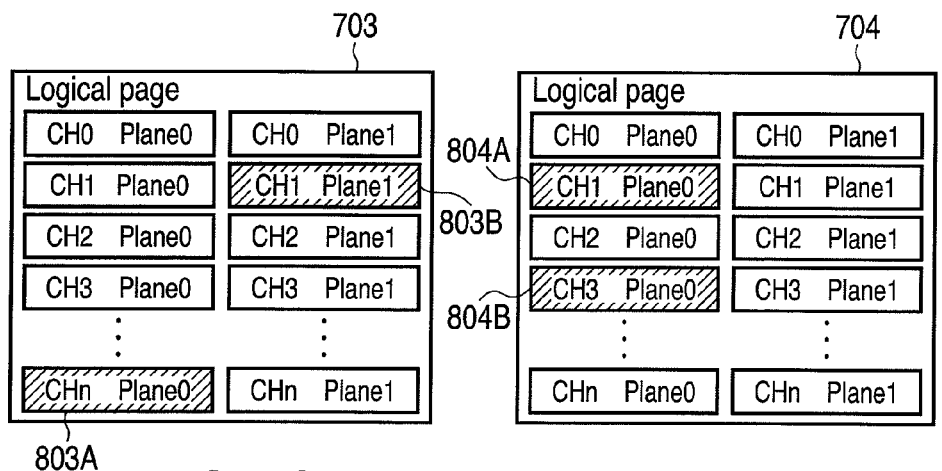
F I G. 8C  F I G. 8D
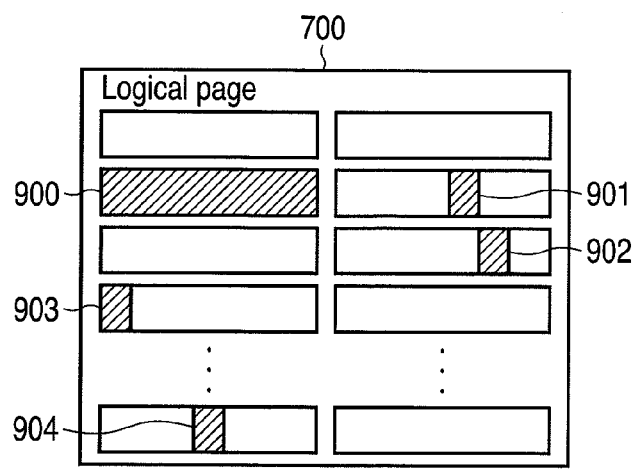
F I G. 9

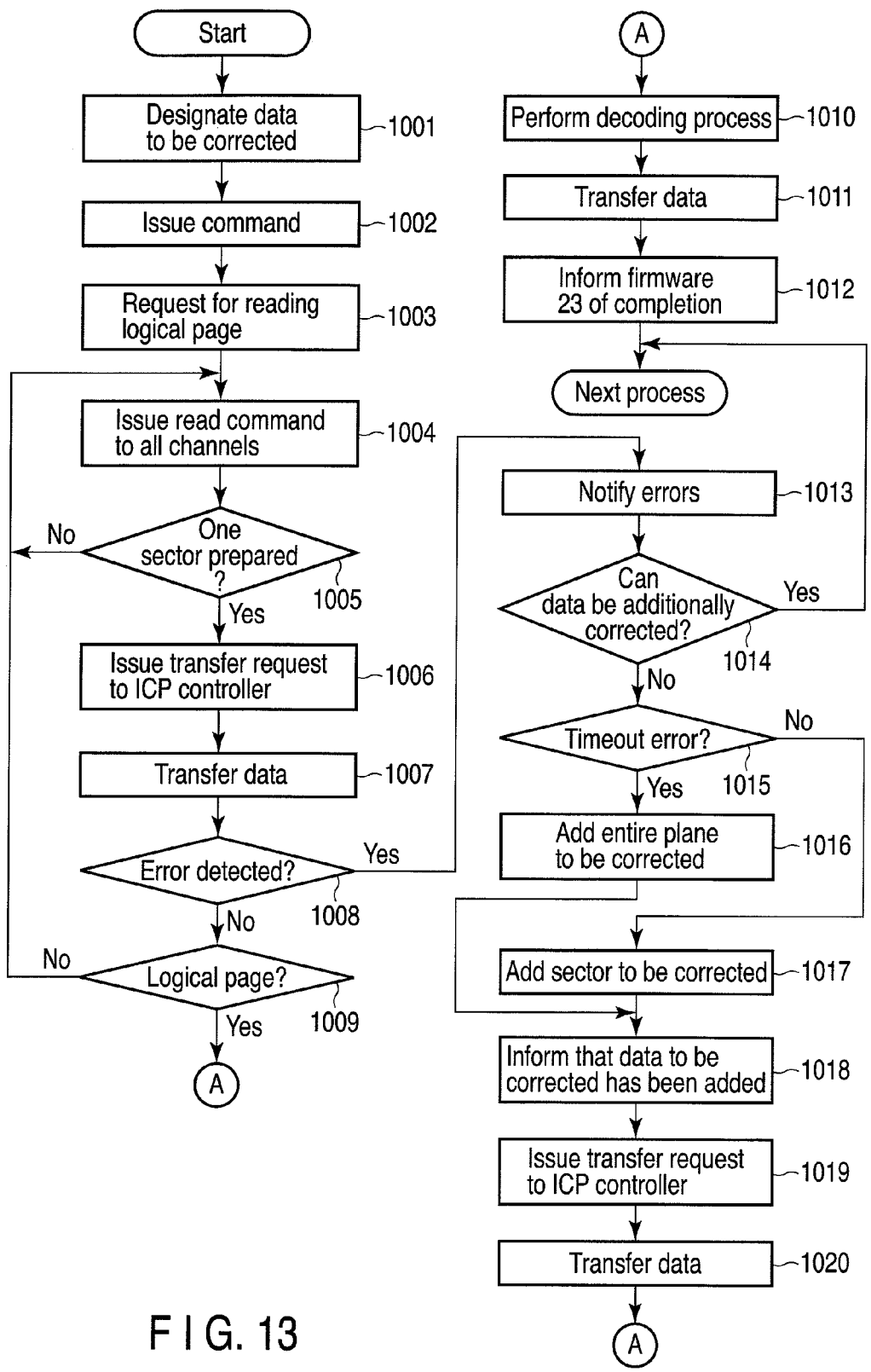
F I G. 13

DATA STORAGE APPARATUS, MEMORY CONTROL APPARATUS AND METHOD FOR CONTROLLING FLASH MEMORIES

CROSS-REFERENCE TO RELATED APPLICATIONS

This application is based upon and claims the benefit of priority from prior Japanese Patent Application No. 2011-014178, filed Jan. 26, 2011, the entire contents of which are incorporated herein by reference.

FIELD

Embodiments described herein relate generally to a data storage apparatus, a memory control apparatus and a method for controlling flash memories.

BACKGROUND

In recent years, solid-state drives (SSDs) have been developed as data storage apparatuses, each using NAND flash memories (hereinafter referred to as "flash memories" in certain cases) that are rewritable nonvolatile memories.

Most SSDs are of a multi-channel type, in which a plurality of flash memories are managed in units of channels and in which data is written to channels in parallel. In any SSD of the multi-channel type, the data (user data) that should be written in each channel is used, thereby generating inter-channel error (ICP) correction codes. If the errors cannot be corrected in units of sectors during the read process, the SSD will perform the inter-channel error correction by using the inter-channel error correction codes.

In the conventional SSD, inter-channel correction codes are generated and saved, whereby the inter-channel error correction can be performed. In the inter-channel error correction, those of the data items in any logical page which should be read are first designated and then decoded (thus achieving data recovery).

A corrective read process is performed in the inter-channel error correction, thereby to read, from each channel, all data that should be decoded. While the corrective read process is proceeding, errors may be detected in data items other than those designated and should be corrected. In this case, all data must be decoded again. This is because of the data items in which errors are detected and which should be corrected. Inevitably, the efficiency of reading data may decrease.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a block diagram explaining the configuration of a data storage apparatus according to an embodiment;

FIG. 2 is a block diagram explaining the configuration of a flash memory controller according to the embodiment;

FIG. 5 is a diagram explaining the concept of another logical page according to the embodiment;

FIG. 6 is a diagram explaining the concept of still another logical page according to the embodiment;

FIG. 7 is a diagram explaining the concept of a further logical page according to the embodiment;

FIGS. 8A, 8B, 8C and 8D are diagrams show examples of data items to be corrected in the embodiment;

FIG. 9 is a diagram showing an example of a data item to correct in the embodiment;

FIG. 13 is a flowchart explaining the sequence of correcting and reading data in the embodiment.

DETAILED DESCRIPTION

Figures 3, 4A, 4B, 4C:
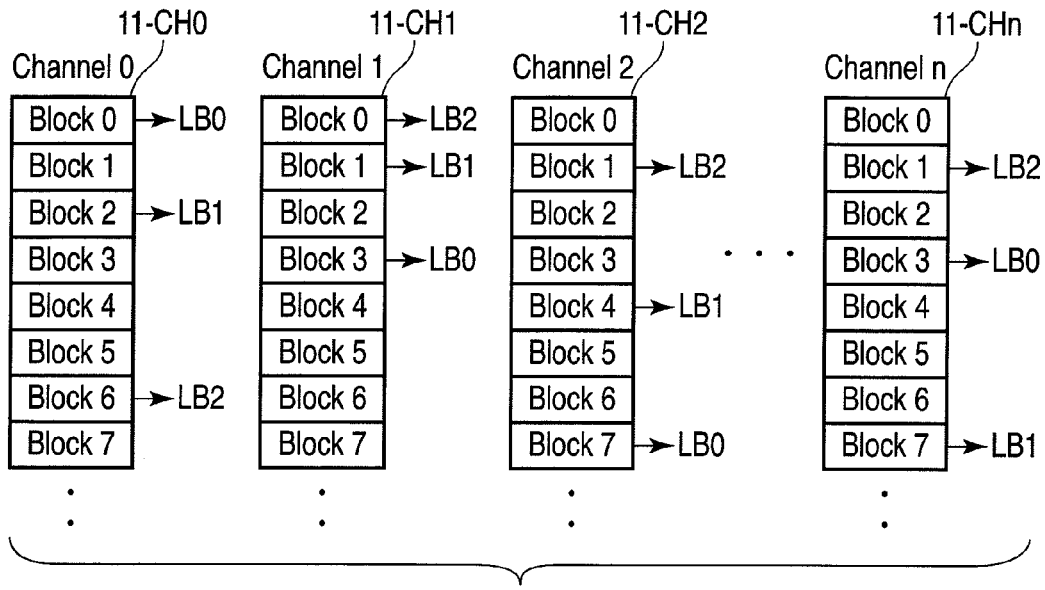
FIG. 3 is a diagram explaining the block configurations of the respective channels according to the embodiment.
FIGS. 4A, 4B and 4C are diagrams explaining the concept of a logical block according to the embodiment.

Various embodiments will be described hereinafter with reference to the accompanying drawings.

In general, according to one embodiment, a data storage apparatus includes a channel controller, an error correction controller, and an additional correction module. The channel controller is configured to control writing to and reading from the nonvolatile memories of respective channels. The error correction controller is configured to use inter-channel error correction codes during any read process, performing inter-channel correction process on those of the data items read under the control of the channel controller, which have been designated. The additional correction module is configured to designate, in accordance with errors detected by the channel controller, data items to additionally correct, and to notify the data items so designated to the error correction controller while the channel controller is reading the data necessary in the inter-channel correction process.

EMBODIMENT FOR CARRYING OUT THE INVENTION

An embodiment will be described with reference to the accompanying drawings.

[Configuration of the Data Storage Apparatus]

FIG. 1 is a block diagram explaining the configuration of a data storage apparatus according to an embodiment.

As shown in FIG. 1, the data storage apparatus according to the embodiment is a solid-state drive (SSD) 10. The SSD 10 has NAND flash memories (flash memories) 11, a buffer 12 constituted by a dynamic random access memory (DRAM), and an SSD controller 20.

The flash memories 11 are the data storage media of in the SSD 10. The SSD 10 according to the embodiment is a multi-channel type that has the flash memories 11 provided in the form of flash memory chips that are associated with channels CH0 to CHn, respectively, as will be described later.

The SSD controller 20 has a host interface controller 21, a DRAM controller 22, a microprocessor (CPU) 23, a flash memory controller 24, and a bus 25.

The host interface controller 21 has a function of performing communicating between the SSD 10 and a host system 30 and controlling the input and output of data and commands (i.e., data transfer). The host system 30 is, for example, a personal computer. The DRAM controller 22 is configured to control the buffer 12. More precisely, it controls the input and output of data (i.e., data transfer) with respect to the buffer 12. The buffer 12 temporarily stores the data (write data) received from the host system 30 and the data (read data) read from any flash memory 11. The buffer 12 also stores the statistical data representing the number of times each flash memory 11 has been accessed, and the address conversion data used to manage the data stored in each flash memory 11.

The microprocessor (CPU) 23 controls the host interface controller 21, the DRAM controller 22, and the flash memory controller 24, through the bus 25. The CPU 23 receives commands coming from the host system 20 and executes any commands to write data to, or read data from, the flash memories 11.

The CPU 23 includes an inter-channel error correction module configured to control an inter-channel error correction process. The inter-channel error correction process uses inter-channel error correction codes (i.e., inter-channel parity [ICP] codes). Hereinafter, the inter-channel error correction process will be referred to as an "ICP process" in certain cases. Also hereinafter, the inter-channel parity code may be referred to as "IC parity data" and the CPU 23 may be referred to as firmware in contrast to the flash memory controller 24, which is hardware.

The flash memory controller (hereinafter referred to as a "flash controller" in certain cases) 24 performs a read/write control and a data transfer control on the flash memories 11, which are flash memory chips associated with channels CH0 to CHn, respectively (FIG. 2). The SSD 10 has the buffer 12. The buffer 12 temporarily bold data, because the host system 30 and each flash memory 11 transfer data at different rates. The flash controller 24 is configured to store, in an internal command queue, a request for data transfer from the buffer 12 to any flash memory 11 through the bus 25.

(Configuration of the Flash Controller)

As shown in FIG. 2, the flash controller 24 has a bus interface 40, a channel controller 41, a register 42, an additional correction module 43, an inter-channel sync controller 44, and an inter-channel error correction code controller 45 (hereinafter referred to as an "ICP controller" in certain cases).

The bus interface 40 is connected to the bus 25 of the SSD controller 20 and is configured to control the data transfer through the bus 25. The channel controller 41 comprises controllers (hereinafter referred to as "NAND controllers") 41-CH0 to 41-CHn. NAND controllers 41-CH0 to 41-CHn are associated with channels CH0 to CHn and configured to control data input/output to and from flash memories 11-CH0 to 11-CHn, respectively.

The inter-channel sync controller 44 controls the ICP controller 45, causing the same to synchronize the data transfer from channels CH0 to CHn during a corrective read process. (The corrective read process will be explained later.) More specifically, the inter-channel sync controller 44 performs a data transfer control, first arranging data items necessary for data decoding in a specific order, and then transferring these data items to the ICP controller 45.

The ICP controller 45 has an encoder 46 and a decoder 47. The encoder 46 generates inter-channel error correction codes (IC parity data). The decoder 47 uses the IC parity data, performing decoding (data recovery process). As described above, the flash controller 24 according to this embodiment has the additional correction module 43. The additional correction module 43 designates a data item to be additionally corrected and notifies this data item to the ICP controller 45, while data corrected is being read, if errors are detected in data items other than those designated by the firmware 23.

In this embodiment, the flash controller 24 reads data necessary to achieve data recovery (decoding process) from the flash memories 11 if errors that should be subjected to the ICP process are detected during the read process. The process of reading the data necessary to achieve data recovery is herein defined as a "corrective read process." During the corrective read process, the flash controller 24 has an operating phase in which the ICP controller 45 reads all data for use in the decoding process. In this operating phase, the additional correction module 43 informs the ICP controller 45 of any data items that contains errors and should therefore be additionally corrected.

[Corrective Read Process]

It will be explained how the flash controller 24 performs the corrective read process in the embodiment.

In the SSD 10 according to the embodiment, the flash controller 24 performs the write process in units of logical pages. Therefore, data is written in units of logical pages into the flash memories 11, by performing a write process. More precisely, the flash controller 24 writes logical pages of data, in parallel, to flash memories 11-CH0 to 11-CHn for channels CH0 to CHn.

In the SSD 10 according to the embodiment, the encoder 46 of the ICP controller 45 generates inter-channel error correction codes (IC parity data) in units of logical pages by using the data of channels CH0 to CHn, which should be written in the write process. The flash controller 24 writes the IC parity data, thus generated, flash memory 11-CHn of any channel designated. The IC parity data is, for example, Reed-Solomon encoded data.

The concepts of a logical block and a logical page will be described with reference to FIG. 3, FIGS. 4A to 4C, and FIGS. 5, 6 and 7.

In the SSD 10, one block of data is erased at a time in each flash memory 11. FIG. 3 is a diagram explaining the block configurations in flash memories 11-CH0 to 11-CHn associated with channels CH0 to CHn. Note that a logical block is a unit of data consisting of data blocks selected from flash memories 11-CH0 to 11-CHn for respective channels CH0 to CHn. The data blocks so selected can be processed altogether at a time.

FIGS. 4A, 4B and 4C show logical blocks 0 (LB0) to 2 (LB2), which are logical blocks according to this embodiment. As can be seen from FIG. 4A, logical block 0 (LB0) consists of block 0 of channel 0, block 3 of channel 1, block 7 of channel 2, . . . , and block 3 of channel n. As can be seen from FIG. 4B, logical block 1 (LB1) consists of block 2 of channel 0, block 1 of channel 1, block 4 of channel 2, . . . , and block 7 of channel n. As can be seen from FIG. 4C, logical block 2 (LB2) consists of block 6 of channel 0, block 0 of channel 1, block 1 of channel 2, . . . , and block 1 of channel n.

The concept of a logical page will be described with reference to FIGS. 5, 6 and 7.

As described above, a logical block 500 consists of the block of the respective channels CH0 to CHn. One block 501 consists pages, which are smaller units of data. One page 502 consists of planes 600 and 601, which are even smaller units of data.

FIG. 6 shows a logical page 700 composed of Pages m for the respective channels. Based the concepts shown in FIGS. 5 and 6, the logical page 700 can be represented as shown in FIG. 7.

Here, it should be noted that the flash controller 24 of the SSD 10 performs a read process of reading data from each flash memory 11 in units of clusters. Each cluster consists of, for example, eight sectors. Each plane (either plane 0 or plane 1) is equivalent to two clusters. One logical page 700 is, therefore, data whose amount is 4 clusters (32 sectors) multiplied by the number of channels provided.

The read process will be explained with reference to the flowchart of FIG. 12.

Figure 12:
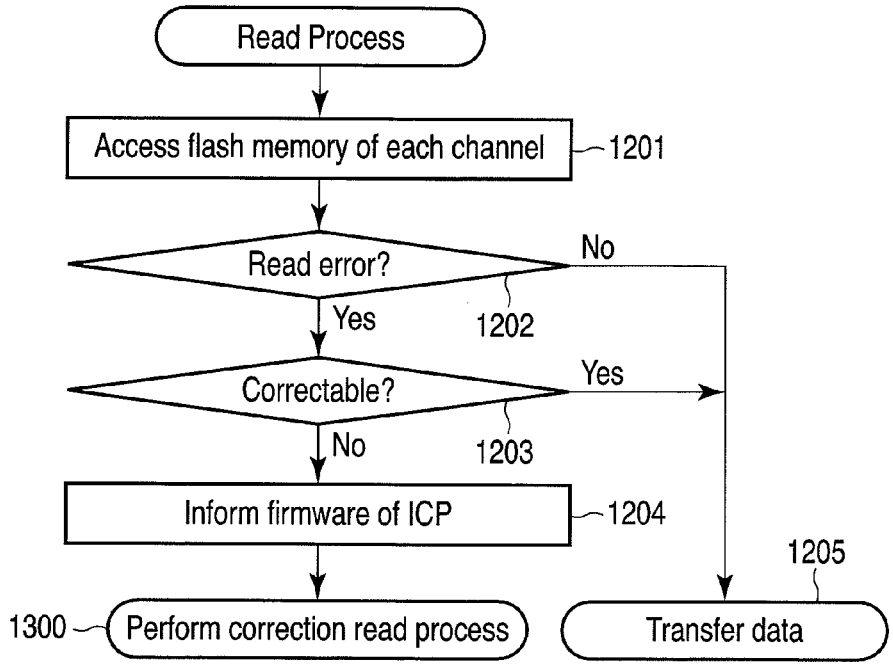
FIG. 12 is a flowchart explaining the sequence of reading data in the embodiment.

As shown in FIG. 12, the flash controller 24 accesses flash memories 11-CH0 to 11-CHn for channels CH0 to CHn, respectively, in response to a command coming from the firmware 23, performing a read process of reading the data requested for (Block 1201). Before NAND controllers 41-CH0 to 41-CHn read data from flash memories 11-CH0 to 11-CHn for respective channels CH0 to CHn, the flash controller 24 detects errors, if any in each sector (Block 1202).

In the format of data to be stored in each flash memory 11, an error correction code (hereinafter referred to as "ECC data") is added to each sector or to each cluster. Using the ECC data, NAND controllers 41-CH0 to 41-CHn perform error correction, thereby recovering the data (YES in Block 120 and YES in Block 1203). The flash controller 24 transfer the data free of errors or the data thus recovered, to the DRAM controller 22 through the bus 25 (Block 1205).

If the data cannot be corrected in units of sectors or clusters in the read process, the flash controller 24 informs the firmware 23 that the ICP process be performed (Block 1204). The ICP controller 45 performs the ICP process using the IC parity data generated in the write process, thereby recovering the data. In response to a command coming from the firmware 23, the flash controller 24 performs the corrective read process that includes the ICP process (Block 1300).

Figure 10:
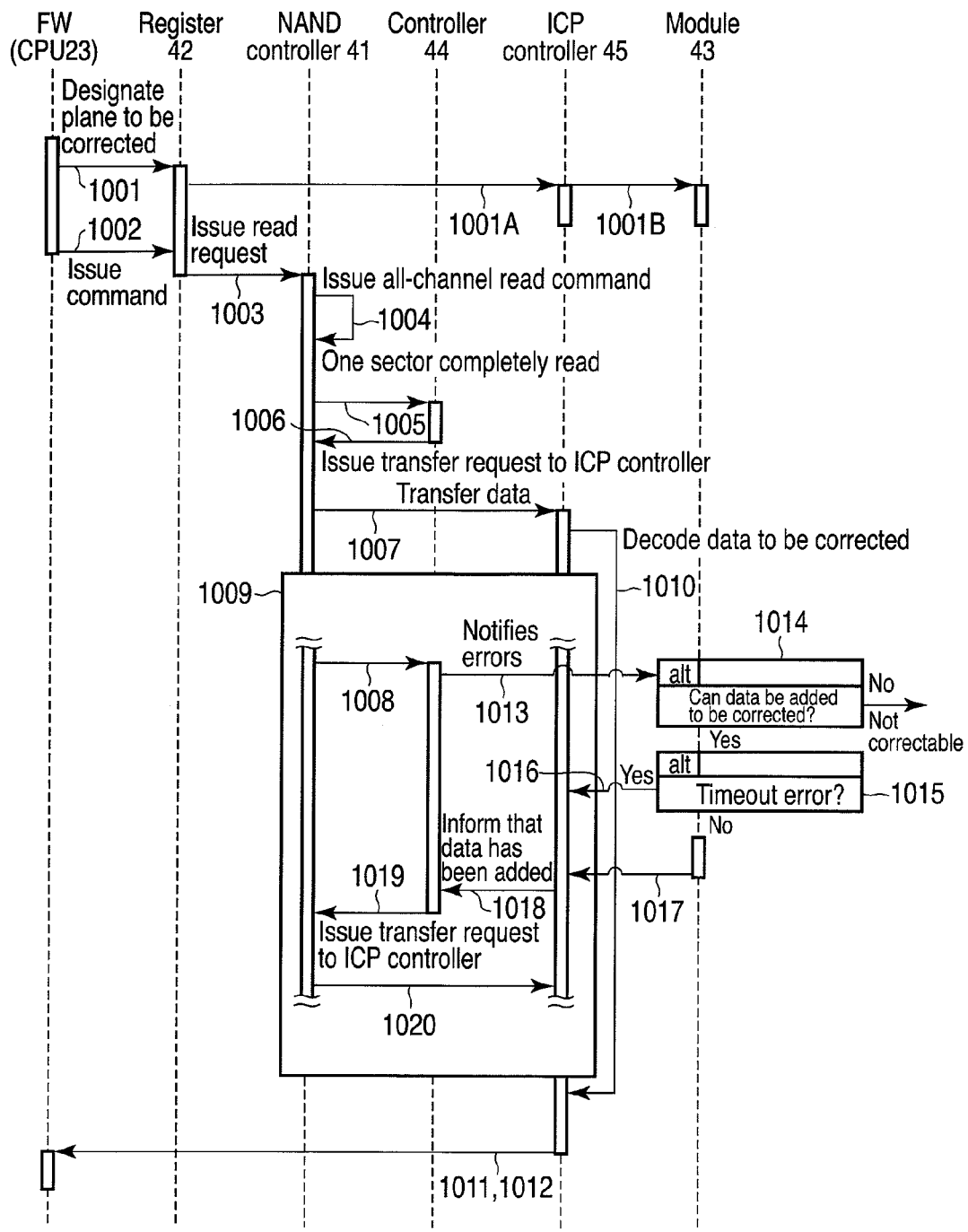
FIG. 10 is a timing chart explaining the sequence of correcting and reading data in the embodiment.

The sequence of the corrective read process will now be explained with reference to the timing chart of FIG. 10 and the flowchart of FIG. 13.

In this embodiment, the ICP controller 45 generates, during the write process, IC parity data in which errors can be corrected for two planes. The IC parity data so generated is written in flash memory 11-CHn of channel CHn designated. The largest number of planes that can be subjected to error correction in one logical page depends on the encoding system used, and is 2 in 2-channel IC parity data, for Reed-Solomon codes. In this case, one logical page pertains to, for example, 16 channels, or 32 (16×2) planes in total. The IC parity data added to this data is a 32-byte Reed-Solomon code.

In accordance with the notification coming from the flash controller 24, the firmware 23 designates a plane that should be corrected in the logical page read in the read process (Block 1001). To be more specific, the firmware 23 sets the plane to be corrected in the register 42 of the flash controller 24 through the bus 25. Also through the bus 25, the plane to be corrected is notified to the ICP controller 45 (Block 1001A). The plane to be corrected is notified also to the additional correction module 43 (Block 1001B).

In the embodiment, the ICP controller 45 also restores data, more precisely a plane (plane 0 or plane 1) missing in any flash memory 11. The firmware 23 therefore sets either plane 0 or plane 1 as a data item that should be corrected.

FIGS. 8A, 8B, 8C and 8D are diagrams show examples of data patterns the firmware 23 can set, each pattern containing data item or items to be corrected in the embodiment. More specifically, FIG. 8A shows a logical page 701 in which one plane 801 (e.g., plane 0 of channel CH1) is set as data item to be corrected. FIG. 8B shows a logical page 702 in which two planes 802A and 802B are set as data items to be corrected. In the case shown in FIG. 8B, the two planes 802A and 802B are plane 0 and plane 1 of the same channel (e.g., CH2). FIG. 8C shows a logical page 703 in which two planes 803A and 803B, i.e., plane 0 of channel CHn and plane 1 of channel CH3, respectively, are set as data items to be corrected. FIG. 8D shows a logical page 704 in which two planes 804A and 804B, i.e., planes 0 of channels CH1 and CH3, respectively, are set as data items to be corrected. Moreover, any plane in which IC parity data is written can be set as a data item that should be corrected.

After designating data items to be corrected, the firmware 23 issues a command instructing that the corrective read process be performed (Block 1002). This command is supplied through the bus 25 and set in the register 42 of the flash controller 24. NAND controllers 41-CH0 to 41-CHn perform error correction, thereby recovering the data (YES in Block 120 and YES in Block 1203). On the basis of the command set in the register 42, NAND controllers 41-CH0 to 41-CHn recognize the read request made with respect to the logical page designated (Block 1003). In the corrective read process, NAND controllers 41-CH0 to 41-CHn have phases in which the ICP controller 45 read all data that will be used in the decoding process.

NAND controllers 41-CH0 to 41-CHn issue read commands to flash memories 11-CH0 to 11-CHn of respective channels CH0 to CHn (Block 1004). When the one-sector data items are completely read from flash memories 11-CH0 to 11-CHn, respectively, NAND controllers 41-CH0 to 41-CHn start performing error detection using the ECC data items added to the sectors, thereby. If no errors are detected to have occurred, NAND controllers 41-CH0 to 41-CHn inform the inter-channel sync controller 44 that all sector data items have been prepared (YES in Block 1005).

While achieving synchronization between the channels, the inter-channel sync controller 44 requests that the ICP controller 45 transfer data from NAND controllers 41-CH0 to 41-CHn (Block 1006). In response to this data-transfer request, NAND controllers 41-CH0 to 41-CHn transfer t the ICP controller 45 the sector data items held in their internal buffers (Block 1007). NAND controllers 41-CH0 to 41-CHn repeat the above-mentioned process until one logical page (e.g., 32 sectors×channels) is read from flash memories 11-CH0 to 11-CHn (Block 1009).

The ICP controller 45 performs the decoding process on all sectors (including IC parity data) coming from channels CH0 to CHn and on the notified planes to be corrected (i.e., data items at error correction positions), thus starting the data recovery process (Block 1010).

While reading data from flash memories 11-CH0 to 11-CHn, NAND controllers 41-CH0 to 41-CHn may detect errors that cannot be corrected by using the ECC data for each sector. In this case, NAND controllers 41-CH0 to 41-CHn inform the inter-channel sync controller 44 and additional correction module 43 that the errors have been detected (Blocks 1008 and 1013).

On the basis of the data position represented by the error notification and the plane designated by the firmware 23 as plane to be corrected, the additional correction module 43 determines whether the data in which errors have been detected this time can be corrected at the same time (Block 1014). More precisely, the additional correction module 43 compares the amount of the data with the amount (e.g., two planes) that the ICP controller 45 can correct in the ICP process, thereby determining whether the data can be added as data to be corrected.

If the additional correction module 43 determines that the data can be corrected, it informs the ICP controller 45 that the sector data in which errors have been detected should be subjected to the additional correction (Block 1017). The amount of the data in which errors have been found may be greater than the amount (e.g., two planes) that the ICP controller 45 can correct. In this case, the additional correction module 43 determines that the data cannot be corrected, and interrupts the additional correction process (NO in Block 1014).

FIG. 9 is a diagram showing an example of a data pattern that should be corrected. As shown in FIG. 9, a logical page 700 includes a plane 900 designated by the firmware 23 and planes 901 to 904 in which errors have been detected and which should therefore be corrected. In the data pattern of FIG. 9, the ICP process cannot correct errors if the data is corrected in units of planes only. The errors cannot be corrected unless the ICP process is of five-plane ICP system. The ICP system according to this embodiment can accomplish an ICP process capable of correcting two planes if two sectors at most are corrected at a time.

The errors notified from NAND controllers 41-CH0 to 41-CHn may be timeout errors. If this is the case, the additional correction module 43 informs the ICP controller 45 that not sectors, but the entire plane must be corrected (Blocks 1015 and 1016). That is, NAND controllers 41-CH0 to 41-CHn recognize the timeout errors if they receive no response from flash memories 11-CH0 to 11-CHn when they issue read commands to flash memories 11-CH0 to 11-CHn. Because of the operating characteristic of any flash memory, any plane that has an error in its head sector is considered a timeout error in its entirety. This is why the additional correction module 43 notifies the ICP controller 45 that any plane that has an error should be subjected to the additional correction process.

After adding the data item to be corrected, the ICP controller 45 informs the inter-channel sync controller 44 of this fact (Block 1018). The inter-channel sync controller 44 then requests for data transfer again. More specifically, while synchronizing the channels, the inter-channel sync controller 44 instructs NAND controllers 41-CH0 to 41-CHn to transfer data to the ICP controller 45 (Block 1019). In response to this instruction, NAND controllers 41-CH0 to 41-CHn transfer the sector data held in their internal buffers to the ICP controller 45 (Block 1020).

The ICP controller 45 performs a decoding process on all sector data (containing IC parity data) coming from channels CH0 to CHn and on the data items (data items at error correction positions) to be additionally corrected, until the data recovery is completed (Block 1010). The ICP controller 45 then transfers the data corrected in the data recovery process, to the DRAM controller 22 through the bus 25 (Block 1011). Thereafter, the ICP controller 45 informs the firmware 23 of the completion of the corrective read process (Block 1012).

The DRAM controller 22 stores the data recovered by the ICP controller 45, in the buffer 12, together with the data normally read in the read process. The host interface controller 21 transfers the read data (containing the data recovered) stored in the buffer 12, to the host system 30 through the DRAM controller 22.

As has been described, the flash controller 24 performs the corrective read process during the read process in this embodiment, first causing the ICP controller 45 to recover any data that cannot be corrected in units of sectors or clusters, and then reading the data thus recovered. If any data other than data (planes) the firmware 23 designates during the corrective read process must be subjected to the additional correction process, the flash controller 24 according to this embodiment continues the corrective read process in order to correct the other data as well (or performs the additional correction data on the other data).

Figure 11:
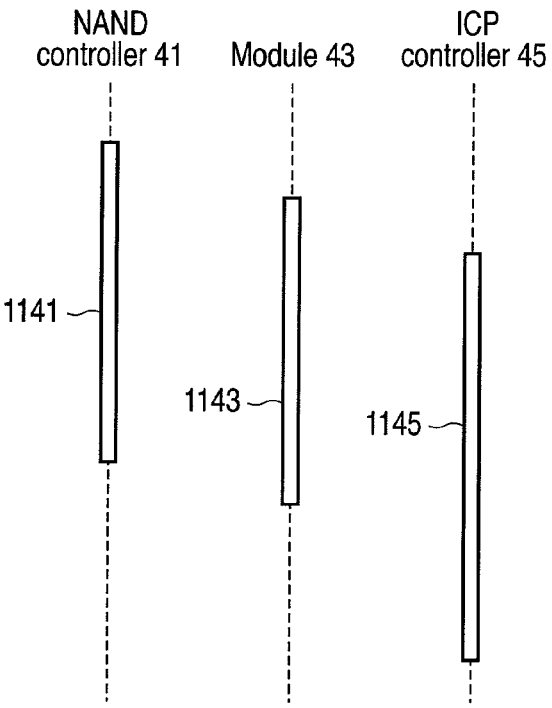
FIG. 11 is a timing chart explaining a pipeline process performed in the embodiment.

In other words, NAND controllers 41-CH0 to 41-CHn, the additional correction module 43 and the ICP controller 45 perform processes 1141, process 1143 and process 1145, respectively, in parallel as shown in FIG. 11, in the flash controller 24 according to this embodiment. That is, a pipeline process is performed, accomplishing the corrective read process.

More precisely, NAND controllers 41-CH0 to 41-CHn performs a process 1141, reading from flash memories 11-CH0 to 11-CHn all data that should be subjected to the decoding process. The additional correction module 43 informs the ICP controller 45 of the data to be subjected to the additional correction process, on the basis of the sector errors detected. The ICP controller 45 performs a decoding process on the data designated to be corrected and the data to be subjected to the additional correction process, and thereby accomplishes data recovery. The inter-channel error correction process can therefore be achieved at a higher efficiency than otherwise. As a result, the efficiency of the read process can increase.

Moreover, the ICP controller 45 according to this embodiment can perform the ICP process on the data to be corrected, not only in units of planes, but also in units of sectors or clusters. This not only increases the efficiency of the inter-channel correction process. In addition, the range of data subjected to the additional correction process can be changed in accordance with the type of errors occurring in the corrective read process, or in accordance with whether the errors are timeout errors or sector errors. This can reduce the operating load on the firmware 23.

The various modules of the systems described herein can be implemented as software applications, hardware and/or software modules, or components on one or more computers, such as servers. While the various modules are illustrated separately, they may share some or all of the same underlying logical or code. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data storage apparatus comprising:
a channel controller configured to control writing to and reading from each of nonvolatile memories of a plurality of channels, detect errors in data read from the nonvolatile memory of each channel and correct the errors;
an error correction controller configured to perform an inter-channel error correction process on first data designated by the channel controller, the designated data indicating that the errors cannot be corrected by the channel controller, wherein the inter-channel error correction process uses inter-channel error correction codes and the inter-channel error correction codes are generated by using the data of the channels written in the writing by the channel controller; and
an additional correction module configured to designate second data to be subjected to an additional correction process and notify the error correction controller of the second data, if errors are detected in the second data by the channel controller while the channel controller is performing a corrective read process of reading data necessary to perform the inter-channel error correction process.

2. The data storage apparatus of claim 1, further comprising a controller configured to cause the channel controller, the error correction controller and the additional correction module to perform a pipeline process.

3. The data storage apparatus of claim 1, wherein the additional correction module is configured to set a range of data to be subjected to the additional correction process based on at least the type of the errors detected by the channel controller from the corrective read process.

4. The data storage apparatus of claim 3, wherein the additional correction module is configured to set, as the range of data to be subjected to the additional correction process, a range of sectors if the errors cannot be corrected in units of sectors, and a range of planes if the errors are timeout errors.

5. A memory control apparatus for use in a data storage apparatus having nonvolatile memories of a plurality of channels, the control apparatus comprising:
- a channel controller configured to control writing to and reading from the nonvolatile memories of the channels, detect errors in data read from the nonvolatile memory of each channel and correct the errors;
- an error correction controller configured to perform an inter-channel error correction process on first data designated by the channel controller, the designated data indicating that the errors cannot be corrected by the channel controller, wherein the inter-channel error correction process uses inter-channel error correction codes and the inter-channel error correction codes are generated by using the data of the channels written in the writing by the channel controller; and
- an additional correction module configured to designate second data to be subjected to an additional correction process and notify the error correction controller of the second data, if errors are detected in the second data by the channel controller while the channel controller is performing a corrective read process of reading data necessary to perform the inter-channel error correction process.

6. The memory control apparatus of claim 5, further comprising a controller configured to cause the channel controller, the error correction controller and the additional correction module to perform a pipeline process.

7. The memory control apparatus of claim 5, wherein the additional correction module is configured to set a range of data to be subjected to the additional correction process based on at least the type of the errors detected by the channel controller during the corrective read process.

8. The memory control apparatus of claim 7, wherein the additional correction module is configured to set, as the range of data to be subjected to the additional correction process, a range of sectors if the errors cannot be corrected in units of sectors, and a range of planes if the errors are timeout errors.

9. A method of controlling flash memories, for use in a data storage apparatus having nonvolatile memories of a plurality of channels, the method comprising:
- controlling writing to and reading from each of nonvolatile memories of a plurality of channels, the controlling comprising detecting errors in data read from the nonvolatile memory and correcting the errors;
- performing an inter-channel error correction process on first data designated and read in a read process, the designated data indicating that the errors cannot be corrected, wherein the inter-channel error correction process uses inter-channel error correction codes and the inter-channel error correction codes are generated by using the data of the channels written in the writing; and
- designating second data to be subjected to an additional correction process, and notifying the inter-channel error correction process of the second data, if errors are detected in the second data during a corrective read process of reading data necessary to perform the inter-channel error correction process.

10. The method of claim 9, wherein the designating sets a range of data to be subjected to the additional correction process based on at least the type of the detected errors.

11. The method of claim 10, wherein the designating sets, as the range of data to be subjected to the additional correction process, a range of sectors if the errors cannot be corrected in units of sectors, and a range of planes if the errors are timeout errors.

* * * * *